(12) United States Patent
Inohara

(10) Patent No.: US 10,615,115 B2
(45) Date of Patent: Apr. 7, 2020

(54) SEMICONDUCTOR DEVICE AND MANUFACTURING METHOD THEREOF

(71) Applicant: TOSHIBA MEMORY CORPORATION, Minato-ku, Tokyo (JP)

(72) Inventor: Masahiro Inohara, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 15 days.

(21) Appl. No.: 15/909,564

(22) Filed: Mar. 1, 2018

(65) Prior Publication Data
US 2019/0088592 A1 Mar. 21, 2019

(30) Foreign Application Priority Data
Sep. 15, 2017 (JP) .................. 2017-178255

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76802* (2013.01); *H01L 21/76843* (2013.01); *H01L 21/76847* (2013.01); *H01L 23/53257* (2013.01); *H01L 23/53266* (2013.01)

(58) Field of Classification Search
CPC ............... H01L 23/5226; H01L 23/53266
See application file for complete search history.

(56) References Cited

U.S. PATENT DOCUMENTS

| | | | |
|---|---|---|---|
| 2008/0099921 A1 | 5/2008 | Katata | |
| 2009/0289370 A1 | 11/2009 | Besser et al. | |
| 2013/0207193 A1 | 8/2013 | Haneda et al. | |
| 2016/0093538 A1* | 3/2016 | Wakatsuki | H01L 21/82387 438/660 |
| 2016/0322377 A1* | 11/2016 | Ide | H01L 27/11582 |

* cited by examiner

Primary Examiner — Marc Anthony Armand
(74) Attorney, Agent, or Firm — Foley & Lardner LLP

(57) ABSTRACT

According to one embodiment, a semiconductor device includes a substrate, a first conductive layer, a second conductive layer, and a contact plug. The first conductive layer is disposed on the substrate and contains a metal silicide. The second conductive layer is disposed on the first conductive layer and contains a metal having bond dissociation energy larger than bond dissociation energy of the metal silicide. The contact plug is disposed on the second conductive layer and includes a main body portion, and a peripheral portion disposed on the surface of the main body portion and containing titanium.

10 Claims, 16 Drawing Sheets

SEMICONDUCTOR DEVICE AND MANUFACTURING METHOD THEREOF

CROSS-REFERENCE TO RELATED APPLICATION

This application claims the benefit of and priority to Japanese Patent Application No. 2017-178255, filed Sep. 15, 2017, the entire contents of which are incorporated herein by reference.

FIELD

Embodiments described herein relate generally to a semiconductor device and a manufacturing method thereof.

BACKGROUND

In a semiconductor memory device, a diffusion layer and a gate electrode of a transistor, and an upper layer wiring, are electrically connected to each other by a contact plug. This contact plug is configured with a metal layer and a barrier metal layer, and provided on a silicide layer formed on silicon. In a structure in which the barrier metal layer of the contact plug is in contact with the silicide layer, there may be a concern that a resistance increases between the contact plug and the silicide layer.

DETAILED DESCRIPTION

Figure 1:
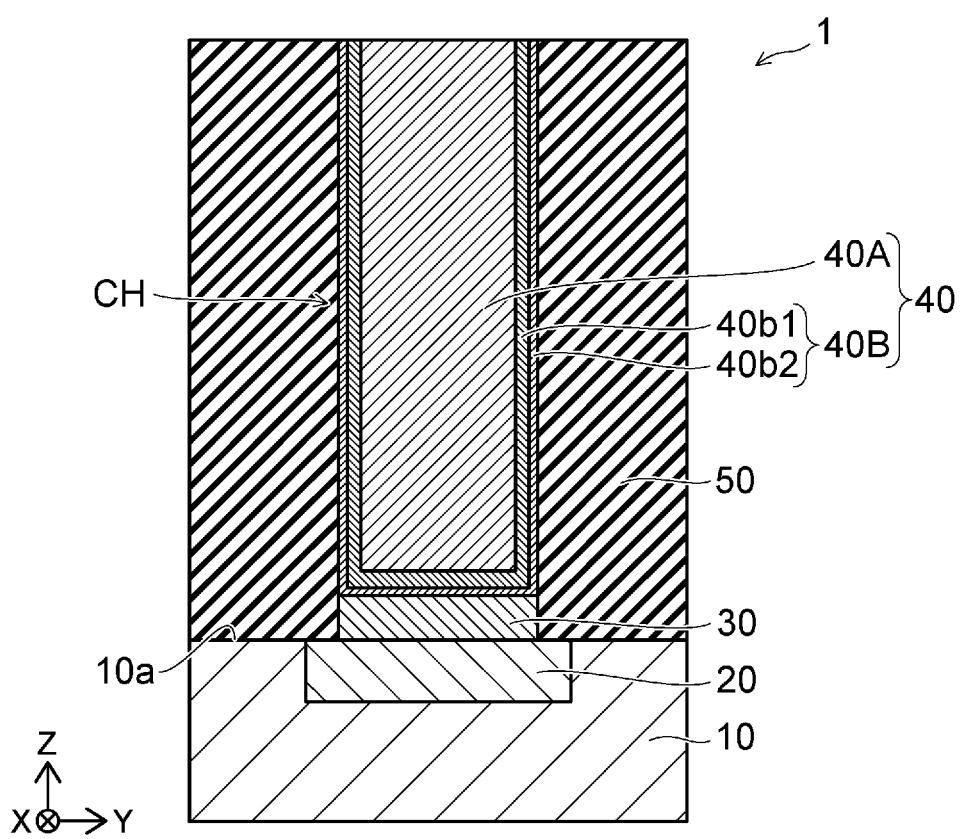
FIG. 1 is a sectional view illustrating a semiconductor memory device according to a first exemplary embodiment.

Exemplary embodiments provide a semiconductor device with an improved electric characteristic, and a manufacturing method thereof.

In general, according to embodiments, a semiconductor device includes a substrate, a first conductive layer, a second conductive layer, and a contact plug. The first conductive layer is provided on the substrate and contains a metal silicide. The second conductive layer is provided on the first conductive layer and contains a metal having bond dissociation energy larger than bond dissociation energy of the metal silicide. The contact plug is provided on the second conductive layer and includes a main body portion and a peripheral portion disposed on the surface of the main body portion and containing titanium.

Hereinafter, exemplary embodiments of the present disclosure will be described with reference to the drawings.

The drawings are schematic or conceptual, and a relationship between a thickness and a width of each portion, a ratio of size between portions, and others may not be necessarily the same as actual ones. Even when the drawings represent the same portion, the respective drawings may differently represent a dimension or a ratio of the portion.

In the descriptions herein and the respective drawings, components similar to those described with respect to a previously described drawing will be denoted by the same reference numerals as used in the previously described drawing, and detailed descriptions thereof will be appropriately omitted.

Hereinafter, in each exemplary embodiment, a semiconductor memory device will be described as an example.

First Exemplary Embodiment

FIG. 1 is a sectional view illustrating a semiconductor memory device 1.

As illustrated in FIG. 1, the semiconductor memory device 1 is provided with a substrate 10, a first conductive layer 20, a second conductive layer 30, a contact plug 40, and an insulating layer 50.

In the descriptions herein, the two directions parallel with the upper surface 10a of the substrate 10 and orthogonal to each other are defined as X and Y directions, respectively. The direction orthogonal to both the X and Y directions is defined as a Z direction. In addition, FIG. 1 represents the Y-Z cross section of the connection portion between the substrate 10 containing silicon (Si) or the like and the contact plug 40, in the semiconductor memory device 1.

The first conductive layer 20 is provided in the upper end portion of the substrate 10. For example, the first conductive layer 20 may be disposed inside the substrate 10 directly below the contact plug 40. The first conductive layer 20 contains, for example, a compound of silicon and a metal (metal silicide). The first conductive layer 20 may be, for example, titanium silicide (TiSi), tungsten silicide (WSi), cobalt silicide (CoSi), or nickel silicide (NiSi).

The second conductive layer 30 is provided on the first conductive layer 20. The second conductive layer 30 contains, for example, a metal such as tungsten (W), niobium (Nb), rhenium (Re), or titanium (Ti).

When the first conductive layer 20 contains metal silicide, and the second conductive layer 30 contains a metal, the bond dissociation energy of the second conductive layer 30 is larger than the bond dissociation energy of the first conductive layer 20.

The bond dissociation energy indicates strength of a chemical bond when a bond of two kinds of atoms is decomposed into individual atoms. For example, in metal silicide, the bond dissociation energy of Ti—Si is 210 kJ/mol, and the bond dissociation energy of W—Si is 159 kJ/mol. For example, in a metal, the bond dissociation energy of W—W is 666 kJ/mol, the bond dissociation energy of Nb—Nb is 513 kJ/mol, and the bond dissociation energy of Re—Re is 432 kJ/mol.

The contact plug 40 is provided on the second conductive layer 30. For example, the lower end of the contact plug 40 is in contact with the second conductive layer 30.

The contact plug 40 has a main body portion 40A and a peripheral portion 40B. The main body portion 40A contains, for example, a metal such as tungsten.

The peripheral portion 40B is provided on the bottom surface and the side surface of the main body portion 40A. The peripheral portion 40B covers the main body portion 40A. The peripheral portion 40B has, for example, layers 40b1 and 40b2. In the X-Y plane, the layer 40b1 is in contact with the outer edge of the main body portion 40A, and the layer 40b2 is in contact with the outer edge of the layer 40b1. That is, the layer 40b1 is disposed between the main body portion 40A and the layer 40b2. For example, the layer 40b1 contains titanium nitride (TiN), and the layer 40b2 contains titanium (Ti). For example, the layers 40b1 and 40b2 constitute a barrier metal layer.

In addition, a case where the layer 40b2 is not provided on the peripheral portion 40B may be conceived.

The upper end of the contact plug 40 is connected to an upper layer wiring (not illustrated).

The insulating layer 50 is provided on the substrate 10. The insulating layer 50 contains, for example, silicon oxide (SiO). A contact hole CH is provided in the insulating layer 50. The second conductive layer 30 and the contact plug 40 are disposed in the contact hole CH.

Next, a method of manufacturing the semiconductor memory device according to the present exemplary embodiment will be described.

Figure 2A:
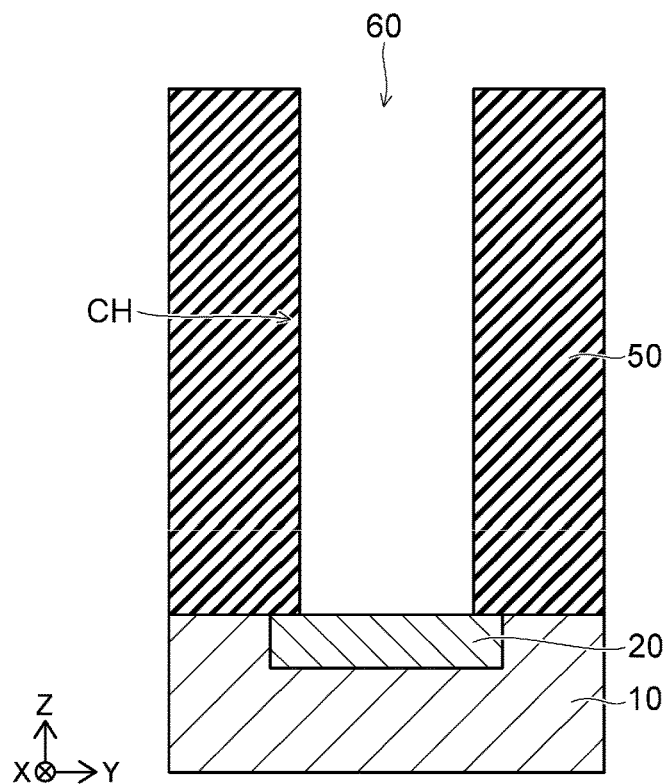
FIGS. 2A and 2B are sectional views illustrating a method of manufacturing the semiconductor memory device according to the first exemplary embodiment.
Figure 2B:
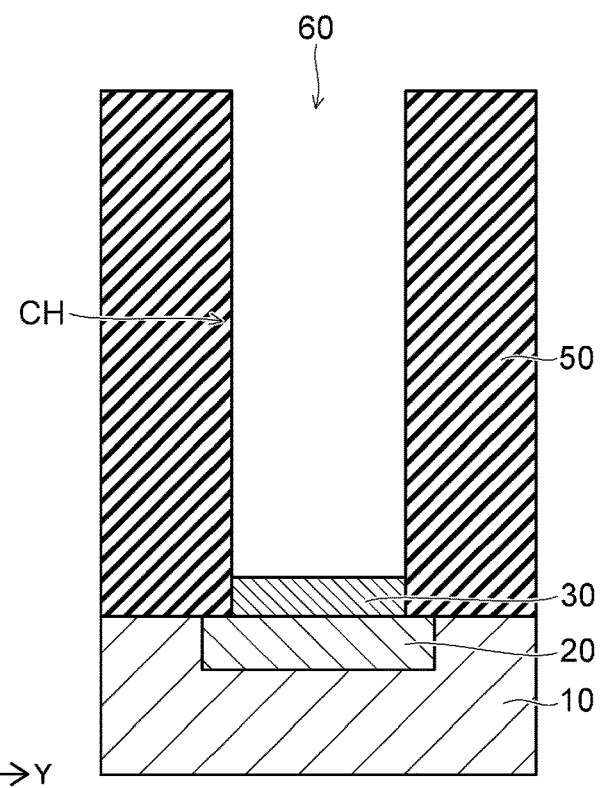
Figure 3:
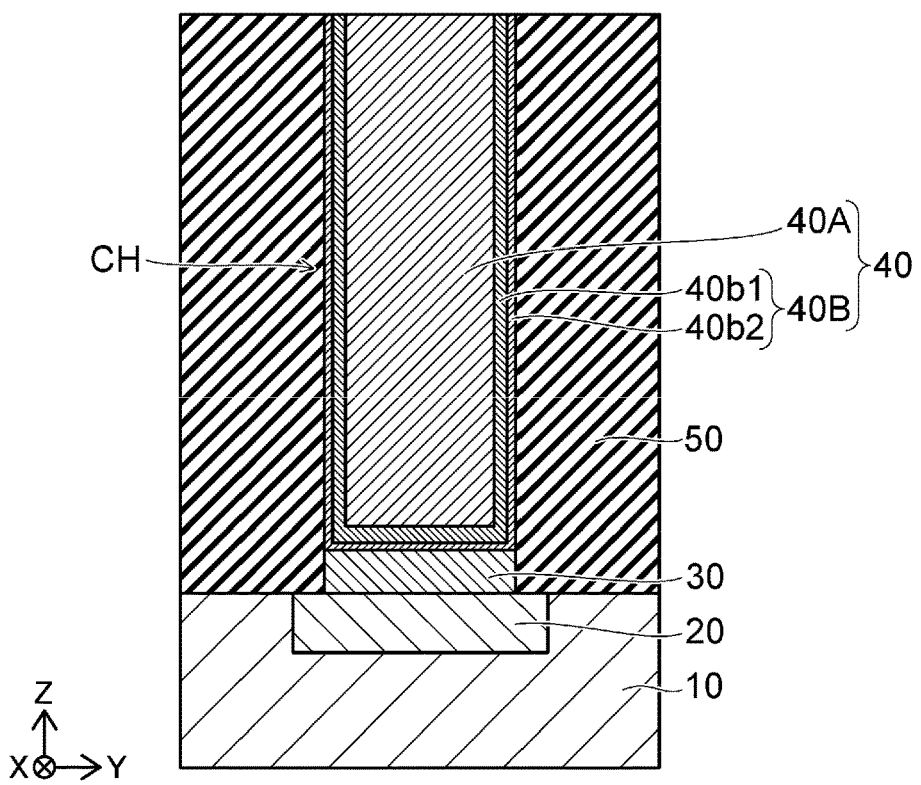
FIG. 3 is a sectional view illustrating the method of manufacturing the semiconductor memory device according to the first exemplary embodiment.

FIGS. 2A, 2B, and 3 are sectional views illustrating a method of manufacturing the semiconductor memory device 1. The regions represented in FIGS. 2A, 2B, and 3 correspond to the regions represented in FIG. 1. Hereinafter, descriptions will be made on forming the connection portion between the substrate 10 and the contact plug 40, in the method of manufacturing the semiconductor memory device 1.

First, as illustrated in FIG. 2A, the insulating layer 50 is formed on the substrate 10 by, for example, a chemical vapor deposition (CVD) method. Subsequently, a hole 60 is formed in the insulating layer 50 by a photolithography method and a reactive ion etching (RIE) method. The hole 60 extends in the Z direction and has the contact hole CH formed in the insulating layer 50.

Subsequently, a stacked layer of titanium and titanium nitride (not illustrated) is formed in the contact hole CH by, for example, a physical vapor deposition (PVD) method. Then, an annealing process is performed. For example, as a condition for the annealing process, the temperature is 700° C. or higher and 750° C. or lower. By the annealing process, titanium and silicon react with each other so that a titanium silicide layer is formed on the upper end of the substrate 10.

Subsequently, a part (titanium and titanium nitride) of the stacked layer that has not reacted by the annealing process is removed using a cleaning liquid. For example, the cleaning liquid is a mixed aqueous solution of sulfuric acid and hydrogen peroxide water. Accordingly, the first conductive layer 20 is formed. The first conductive layer 20 may be formed by forming a recess portion on the substrate 10 and forming another metal silicide layer in the recess portion.

Next, as illustrated in FIG. 2B, the second conductive layer 30 containing a metal such as tungsten is formed on the first conductive layer 20 exposed in the contact hole CH by, for example, a selective CVD method. The second conductive layer 30 is selectively formed on the first conductive layer 20.

Next, as illustrated in FIG. 3, the layer 40b2 containing titanium is formed on the inner wall surface of the contact hole CH and the second conductive layer 30 by, for example, a CVD method. Then, the layer 40b1 containing titanium nitride is formed on the layer 40b2 formed on the inner wall surface and bottom surface of the contact hole CH. Accordingly, the peripheral portion 40B having the layers 40b1 and 40b2 is formed.

Subsequently, the main body portion 40A containing a metal such as tungsten is formed in the contact hole CH where the peripheral portion 40B is formed, by, for example, a CVD method. Accordingly, the contact plug 40 having the main body portion 40A and the peripheral portion 40B is formed.

Subsequently, a titanium layer, a titanium nitride layer, and a metal layer which are formed on the upper surface of the insulating layer 50 outside the contact hole CH are removed by, for example, a chemical mechanical polishing (CMP) method. Then, an upper layer wiring (not illustrated) is formed on, for example, the upper end of the contact plug 40.

In this way, the semiconductor memory device 1 according to the present exemplary embodiment is manufactured.

Next, a modification of the present exemplary embodiment will be described.

Figure 4:
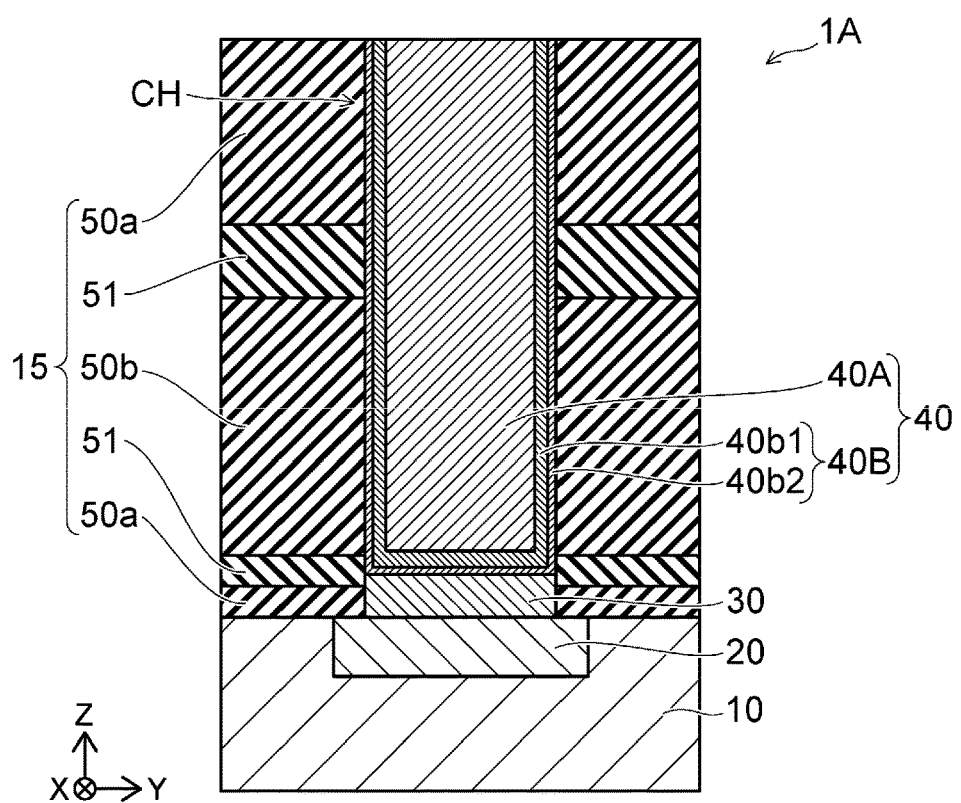
FIG. 4 is a sectional view illustrating a semiconductor memory device according to a modification of the first exemplary embodiment.

FIG. 4 is a sectional view illustrating a semiconductor memory device 1A. The regions represented in FIG. 4 correspond to the regions represented in FIG. 1. In this modification, a stacked body 15 is provided, instead of the insulating layer 50.

As illustrated in FIG. 4, the semiconductor memory device 1A is provided with the substrate 10, the first conductive layer 20, the second conductive layer 30, the contact plug 40, and the stacked body 15.

The stacked body 15 is provided on the substrate 10. The stacked body 15 has a plurality of first insulating layers 50a, a second insulating layer 50b, and a plurality of third insulating layers 51. The first insulating layer 50a, the third insulating layer 51, the second insulating layer 50b, the third insulating layer 51, and the first insulating layer 50a are stacked in this order from the side of the substrate 10 in the Z direction.

The insulating layers 50a and 50b contain, for example, silicon oxide. The insulating layers 51 contain, for example, silicon nitride (SiN). The insulating layers 50a and 50b may be formed of the same material.

The contact hole CH is provided in the stacked body 15. The second conductive layer 30 and the contact plug 40 are disposed in the contact hole CH.

According to the semiconductor memory device 1 (1A) of the present exemplary embodiment, it is possible to reduce the possibility that the electric characteristic may be deteriorated since, for example, a silicon oxide layer or the like is formed in the peripheral portion 40B, and the resistance of the contact plug increases. Hereinafter, this reason will be described.

Figure 5:
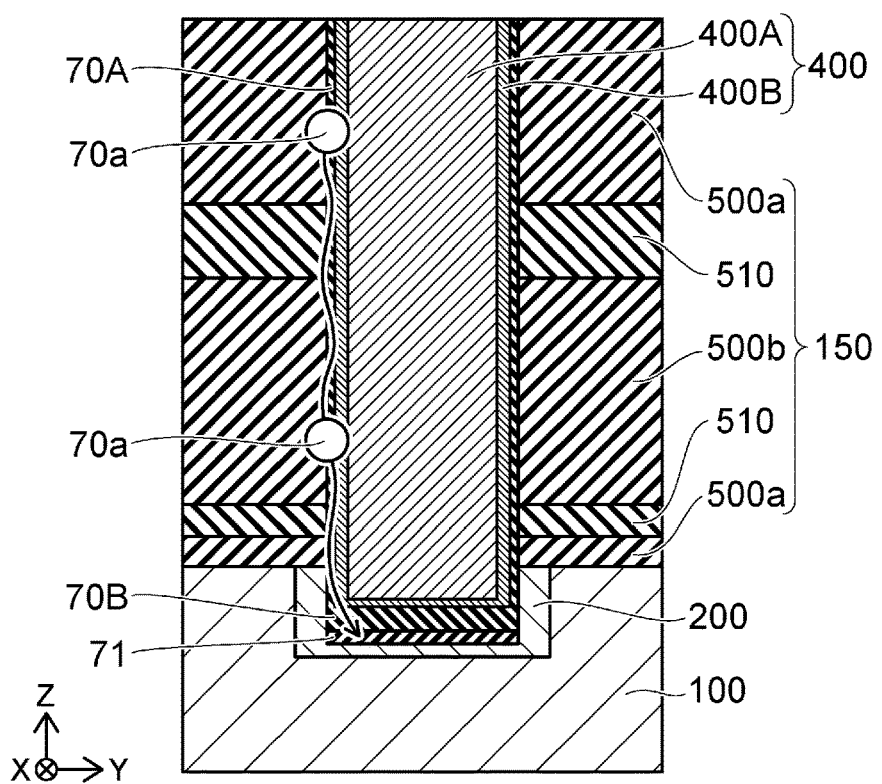
FIG. 5 is a sectional view illustrating a semiconductor memory device according to a reference example.

FIG. 5 is a sectional view illustrating a semiconductor memory device according to a comparative example. The regions represented in FIG. 5 correspond to the regions represented in FIG. 1.

In the semiconductor memory device, a diffusion layer or a gate electrode of a transistor and the upper layer wiring are electrically connected to each other by the contact plug. This contact plug is configured with a metal layer and a barrier metal layer, and provided on a substrate containing single crystal silicon or polycrystalline silicon via a silicide layer.

For example, as illustrated in FIG. 5, a contact plug 400 is configured with a main body portion 400A containing a metal and a peripheral portion 400B containing titanium nitride, and provided on a substrate 100 via a conductive layer 200 containing metal silicide. In this structure, the peripheral portion 400B of the contact plug 400 is in contact with the conductive layer 200.

Here, for example, when a heating process is performed after forming the contact plug 400 in subsequent processes for manufacturing the semiconductor memory device, the contact surface between the peripheral portion 400B containing titanium nitride and the stacked body 150 is oxidized, and thus, an oxide layer 70A containing titanium oxide (TiO) is formed on the contact surface between the peripheral portion 400B and the stacked body 150. Thereafter, as indicated by an arrow in FIG. 5, oxygen 70a in the oxide layer 70A diffuses so that the peripheral portion 400B is oxidized, and an oxide layer 70B containing titanium oxide (TiO) is formed between the peripheral portion 400B and the substrate 100. At this time, for example, when the peripheral portion 400B has the two-layer structure including the layers 40b1 and 40b2 as illustrated in FIG. 1, the layer 40b2 may partially or entirely replace the oxide layers 70A and 70B.

When the oxide layer 70B is formed, an oxide layer 71 containing silicon oxide is formed in the portion where the oxide layer 70B and the conductive layer 200 are in contact with each other.

This oxide layer 71 is formed in the manner that, since the bond dissociation energy of the metal silicide contained in the conductive layer 200 is small (e.g., the bond dissociation energy of Ti—Si is 210 kJ/mol, and the bond dissociation energy of W—Si is 159 kJ/mol), silicon is supplied from the conductive layer 200 to the oxide layer 70B, and oxygen of the oxide layer 70B and the silicon chemically react with each other. For example, like the formula (1) or (2) below, a chemical reaction by the bond dissociation energy occurs.

The numerical value in each parenthesis represents a numerical value of the bond dissociation energy between atoms.

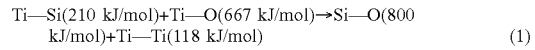

$$\text{Ti—Si(210 kJ/mol)+Ti—O(667 kJ/mol)} \rightarrow \text{Si—O(800 kJ/mol)+Ti—Ti(118 kJ/mol)} \quad (1)$$

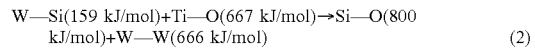

$$\text{W—Si(159 kJ/mol)+Ti—O(667 kJ/mol)} \rightarrow \text{Si—O(800 kJ/mol)+W—W(666 kJ/mol)} \quad (2)$$

Since the oxide layer 71 is disposed between the conductive layer 200 and the contact plug 400, a resistance increases between the conductive layer 200 and the contact plug 400. As a result, the resistance of the contact increases, and the electrical characteristic of the semiconductor memory device is deteriorated.

Meanwhile, in the semiconductor memory device 1 of the present exemplary embodiment, the second conductive layer 30 containing a metal is provided between the contact plug 40 and the first conductive layer 20. When the second conductive layer 30 is provided, the formation of the oxide layer 71 is prevented even in a case where the oxide layers 70A and 70B are formed on the side surface and the bottom surface of the peripheral portion 40B, respectively, as illustrated in FIG. 5. That is, the oxide layer 71 is barely formed in the portion of the oxide layer 70B that is in contact with the second conductive layer 30.

This is because the bond dissociation energy of the metal (e.g., tungsten) contained in the second conductive layer 30 is larger than the bond dissociation energy of the metal silicide (e.g., titanium silicide) contained in the first conductive layer 20 (e.g., the bond dissociation energy of W—W is 666 kJ/mol, and the bond dissociation energy of Ti—Si is 210 kJ/mol), and thus, the metal in the second conductive layer 30 barely causes the chemical reaction with the titanium oxide in the oxide layer 70B, as compared with the metal silicide. That is, since the second conductive layer 30 is provided between the oxide layer 70B and the first conductive layer 20, the occurrence of the chemical reaction with the titanium oxide is prevented, and thus, the formation of the silicon oxide layer is prevented, as compared with the structure in which the oxide layer 70B and the conductive layer 200 are in contact with each other as illustrated in FIG. 5. Thus, the increase of the resistance between the first conductive layer 20 and the contact plug 40 is prevented. As a result, the electric characteristic of the semiconductor memory device 1 is improved.

According to the present exemplary embodiment, a semiconductor device with an improved electric characteristic and a manufacturing method thereof are provided.

In the semiconductor memory device 1 of FIG. 1, for example, when a heating process such as an annealing process is performed in a cell region during the manufacturing process, the oxide layers 70A and 70B may be formed on the side surface and the bottom surface of the peripheral portion 40B (as illustrated in FIG. 5). That is, in the semiconductor memory device 1 of FIG. 1, the oxide layers 70A and 70B may be provided on the side surface and the bottom surface of the peripheral portion 40B. As described above, the oxide layers 70A and 70B contain, for example, titanium oxide.

Second Exemplary Embodiment

Figure 6:
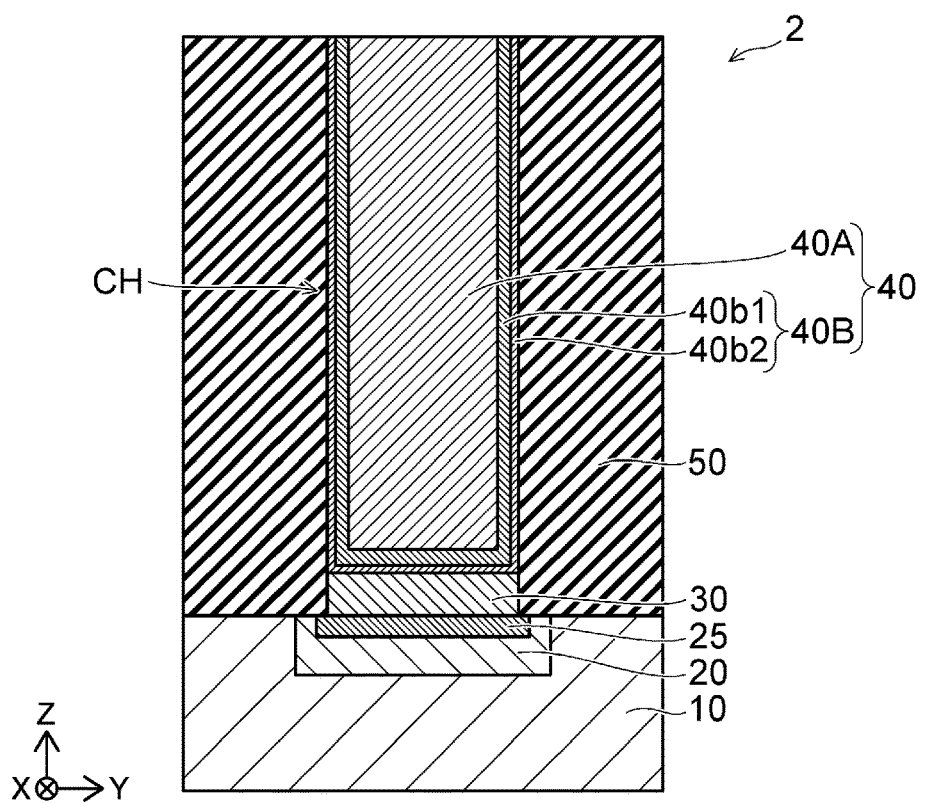
FIG. 6 is a sectional view illustrating a semiconductor memory device according to a second exemplary embodiment.

FIG. 6 is a sectional view illustrating a semiconductor memory device 2.

The regions represented in FIG. 6 correspond to the regions represented in FIG. 1.

The semiconductor memory device 2 according to the present exemplary embodiment is different from the semiconductor memory device 1 according to the first exemplary embodiment in that, in the semiconductor memory device 2, a third conductive layer 25 is provided between the first conductive layer 20 and the second conductive layer 30. Since the configurations of the second exemplary embodiment other than the third conductive layer 25 are identical to those in the first exemplary embodiment, detailed descriptions thereof will be omitted.

As illustrated in FIG. 6, the semiconductor memory device 2 is provided with the substrate 10, the first conductive layer 20, the third conductive layer 25, the second conductive layer 30, the contact plug 40, and the insulating layer 50.

The third conductive layer 25 is provided on the first conductive layer 20. For example, the third conductive layer 25 is disposed on the upper end of the first conductive layer 20, and the side surface and the bottom surface of the third conductive layer 25 are surrounded by the first conductive layer 20. The third conductive layer 25 contains, for example, titanium nitride. The second conductive layer 30 is provided on the third conductive layer 25.

Next, a method of manufacturing the semiconductor memory device according to the present exemplary embodiment will be described.

FIGS. 7A, 7B, 8A, 8B, and 9 are sectional views illustrating a method of manufacturing the semiconductor memory device 2. The regions represented in FIGS. 7A, 7B, 8A, 8B, and 9 correspond to the regions represented in FIG. 6.

Figure 7A:
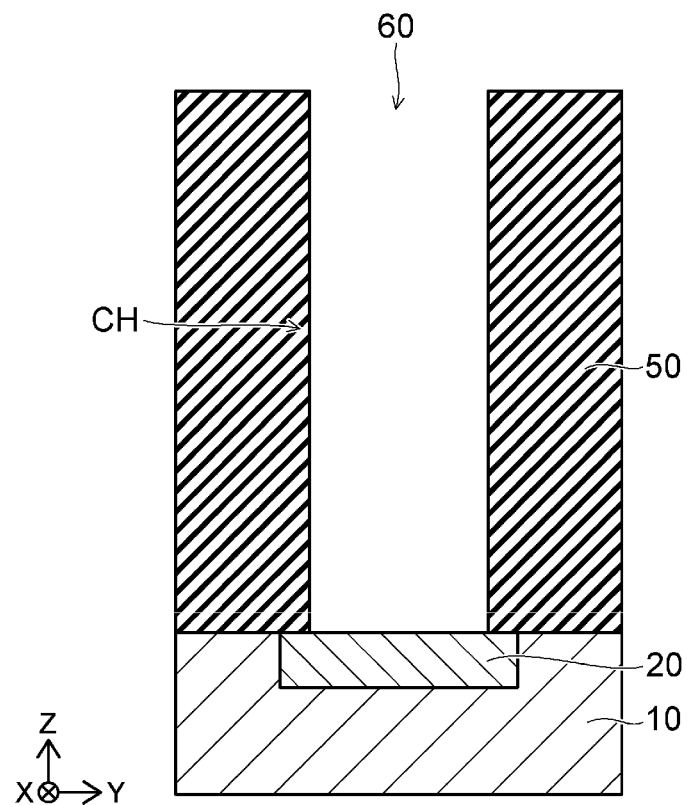
FIGS. 7A and 7B are sectional views illustrating a method of manufacturing the semiconductor memory device according to the second exemplary embodiment.

First, as illustrated in FIG. 7A, the insulating layer 50 is formed on the substrate 10, and then, the hole 60 is formed in the insulating layer 50. The hole 60 has the contact hole CH. Subsequently, a stacked layer of titanium and titanium nitride is formed in the contact hole CH, and then, an annealing process is performed on the stacked layer. By the annealing process, titanium and silicon react with each other so that the first conductive layer 20 which is a titanium silicide layer is formed on the upper end of the substrate 10.

Subsequently, a part (titanium and titanium nitride) of the stacked layer that has not reacted by the annealing process is removed. The first conductive layer 200 may be formed by forming another metal silicide layer in a recess portion formed on the substrate 10.

Figure 7B:
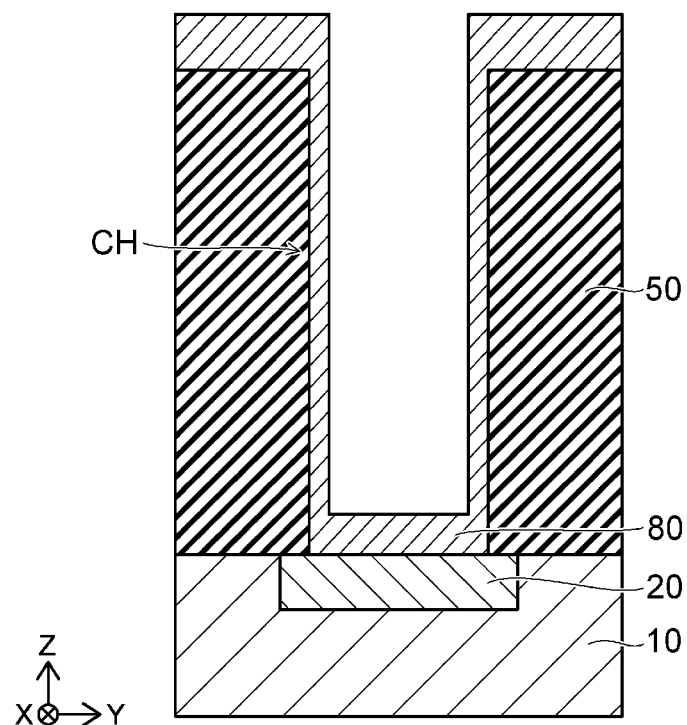

Next, as illustrated in FIG. 7B, a layer 80 is formed on the inner surface of the contact hole CH by, for example, a PVD method or a CVD method. In the layer 80, metal nitride, for example, tungsten nitride (WN) is formed. The layer 80 is formed on the first conductive layer 20. Further, the layer 80 is formed on the insulating layer 50.

Figure 8A:
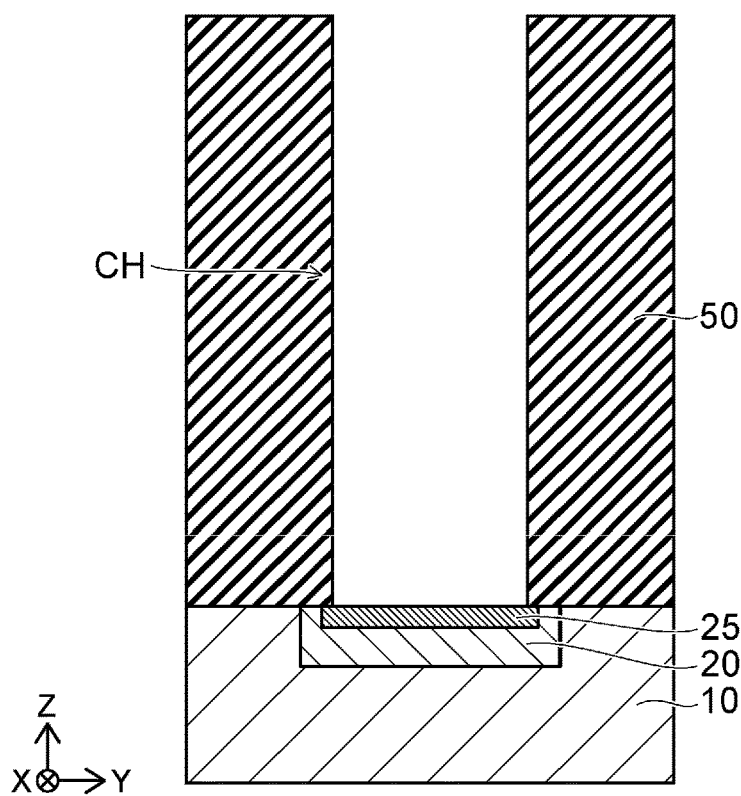
FIGS. 8A and 8B are sectional views illustrating the method of manufacturing the semiconductor memory device according to the second exemplary embodiment.

Next, as illustrated in FIG. 8A, an annealing process is performed on the layer 80 on the first conductive layer 20 through the contact hole CH. For example, as a condition for the annealing process, the temperature is about 900° C. By the annealing process, the third conductive layer 25 is formed on the upper end of the first conductive layer 20. Subsequently, the layer 80 in the contact hole CH is removed using a cleaning liquid. For example, the cleaning liquid is a mixed aqueous solution of sulfuric acid and hydrogen peroxide water. The layer 80 may be removed by a chemical dry etching (CDE) method, instead of using the cleaning liquid.

Accordingly, the third conductive layer 25 containing titanium nitride is formed in the first conductive layer 20.

Figure 8B:
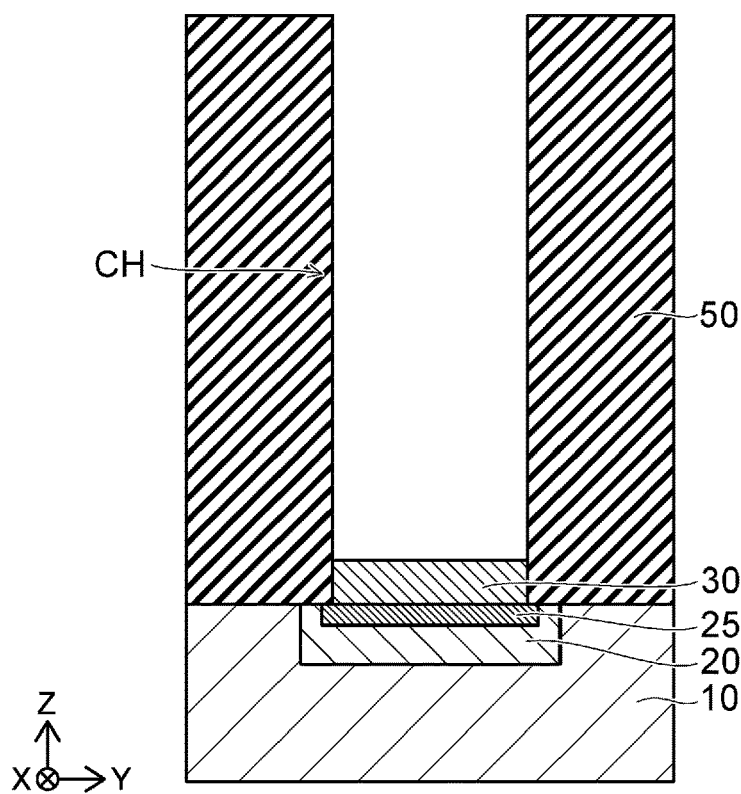

Next, as illustrated in FIG. 8B, the second conductive layer 30 containing a metal such as tungsten is formed on the third conductive layer 25 exposed in the contact hole CH by, for example, a selective CVD method. The second conductive layer 30 is selectively formed on the third conductive layer 25.

Figure 9:
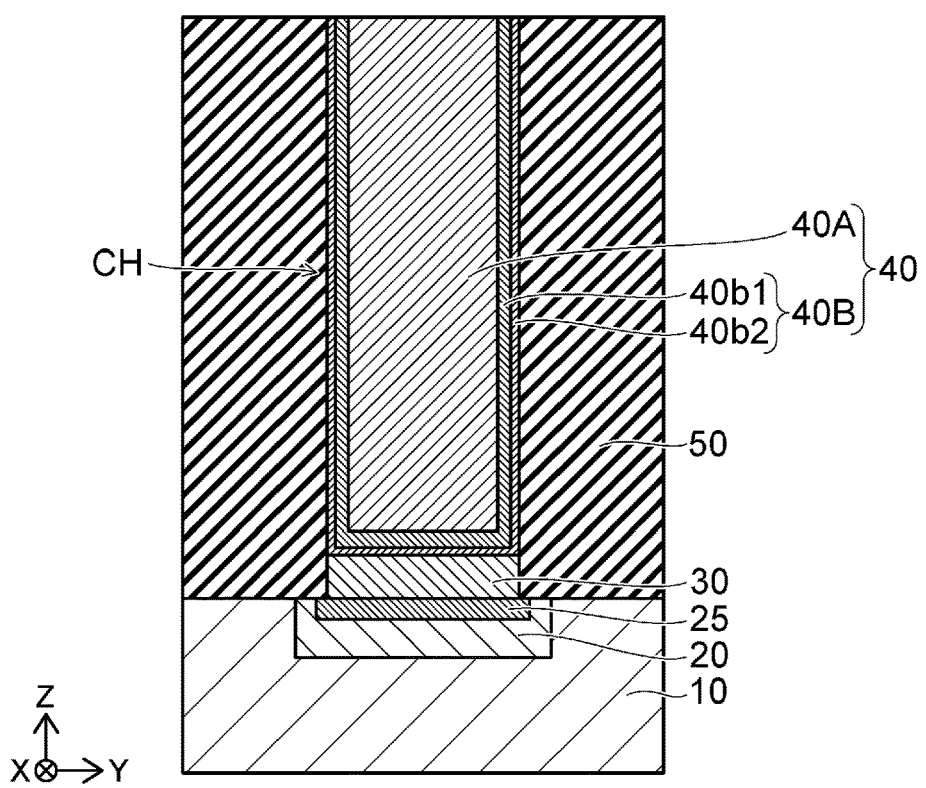
FIG. 9 is a sectional view illustrating the method of manufacturing the semiconductor memory device according to the second exemplary embodiment.

Next, as illustrated in FIG. 9, the layer 40$b$2 containing titanium is formed on the inner wall surface of the contact hole CH and the conductive layer 30, and then, the layer 40$b$1 containing titanium nitride is formed on the layer 40$b$2 in the contact hole CH. Accordingly, the peripheral portion 40B having the layers 40$b$1 and 40$b$2 is formed.

Subsequently, the main body portion 40A containing a metal such as tungsten is formed on the peripheral portion 40B (the layer 40$b$1) in the contact hole CH. Accordingly, the contact plug 40 having the main body portion 40A and the peripheral portion 40B is formed. The subsequent processes are the same as those in the first exemplary embodiment.

In this way, the semiconductor memory device 2 according to the present exemplary embodiment is manufactured.

Next, a modification of the present exemplary embodiment will be described.

Figure 10:
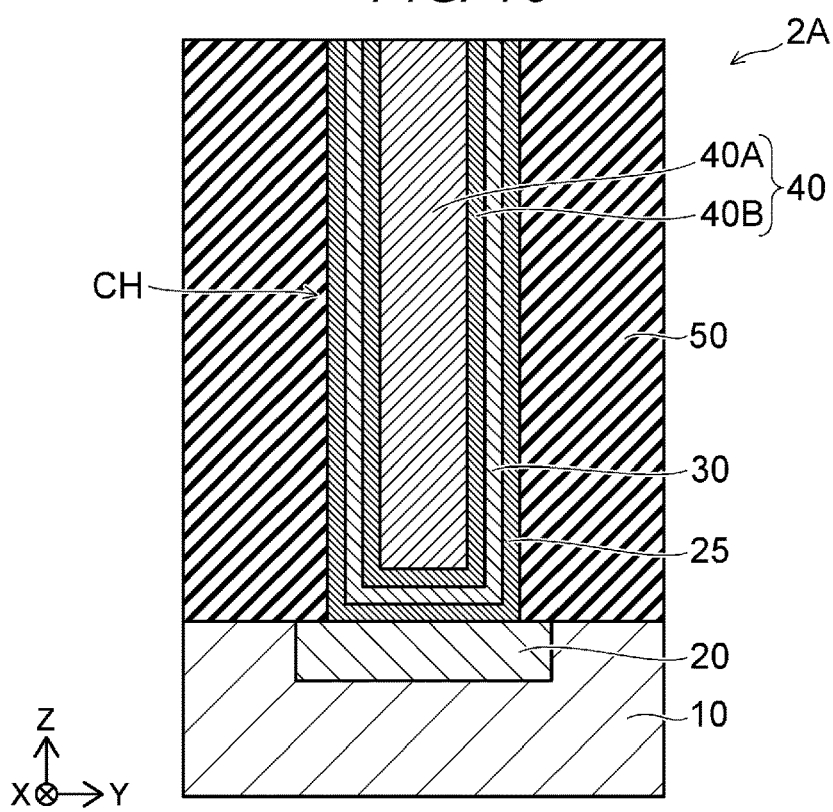
FIG. 10 is a sectional view illustrating a semiconductor memory device according to a modification of the second exemplary embodiment.

FIG. 10 is a sectional view illustrating a semiconductor memory device 2A. The regions represented in FIG. 10 correspond to the regions represented in FIG. 6. In this modification, the shapes of the third conductive layer 25 and the second conductive layer 30 are different from those in the second exemplary embodiment.

As illustrated in FIG. 10, the semiconductor memory device 2A is provided with the substrate 10, the first conductive layer 20, the third conductive layer 25, the second conductive layer 30, the contact plug 40, and the insulating layer 50. The contact plug 40 has the main body portion 40A containing a metal such as tungsten and the peripheral portion 40B containing titanium nitride or the like.

The third conductive layer 25 is provided on the first conductive layer 20. Further, the third conductive layer 25 is provided on the side surface and the bottom surface of the second conductive layer 30. For example, the third conductive layer 25 has a cylindrical shape having a bottom.

The second conductive layer 30 is provided on the third conductive layer 25. Further, the second conductive layer 30 is provided on the side surface and the bottom surface of the contact plug 40. For example, the second conductive layer 30 has a cylindrical shape having a bottom.

The third conductive layer 25, the second conductive layer 30, and the contact plug 40 are provided in order from the insulating layer 50 toward the main body portion 40A. For example, a titanium nitride layer and a tungsten layer are alternately provided on the inner surface of the contact hole CH.

According to the semiconductor memory device 2 (2A) of the present exemplary embodiment, the deterioration of the electric characteristic due to the increase of the resistance of the contact plug may be prevented, as in the first exemplary embodiment.

Third Exemplary Embodiment

Figure 11:
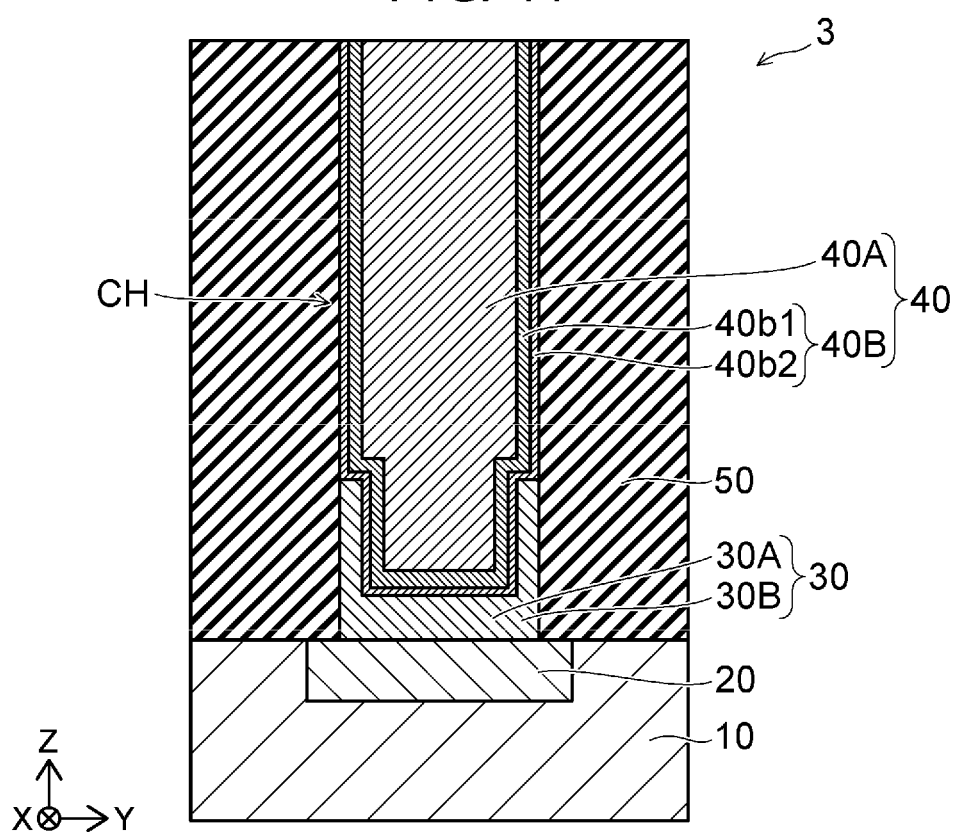
FIG. 11 is a sectional view illustrating a semiconductor memory device according to a third exemplary embodiment.

FIG. 11 is a sectional view illustrating a semiconductor memory device 3.

The regions represented in FIG. 11 correspond to the regions represented in FIG. 1.

The semiconductor memory device 3 according to the present exemplary embodiment is different from the semiconductor memory device 1 according to the first exemplary embodiment in the shape of the second conductive layer 30. Since the configurations of the third exemplary embodiment other than the shape of the second conductive layer 30 are identical to those in the first exemplary embodiment, detailed descriptions thereof will be omitted.

As illustrated in FIG. 11, the semiconductor memory device 3 is provided with the substrate 10, the first conductive layer 20, the second conductive layer 30, the contact plug 40, and the insulating layer 50.

The second conductive layer 30 is provided on the first conductive layer 20. The second conductive layer 30 has a central portion 30A and a peripheral portion 30B. The central portion 30A is provided at the center of the first conductive layer 20, as compared with the peripheral portion 30B. The peripheral portion 30B is provided at the end of the first conductive layer 20, as compared with the central portion 30A. The peripheral portion 30B surrounds the periphery of the central portion 30A.

The central portion 30A and the peripheral portion 30B are formed to be integrated with each other so that the second conductive layer 30 has the shape of, for example, the character C in the Y-Z plane.

The contact plug 40 is provided on the conductive layer 30.

Next, a method of manufacturing the semiconductor memory device according to the present exemplary embodiment will be described.

FIGS. 12A, 12B, 13A, and 13B are sectional views illustrating a method of manufacturing the semiconductor memory device 3. The regions represented in FIGS. 12A, 12B, 13A, and 13B correspond to the regions represented in FIG. 11.

Figure 12A:
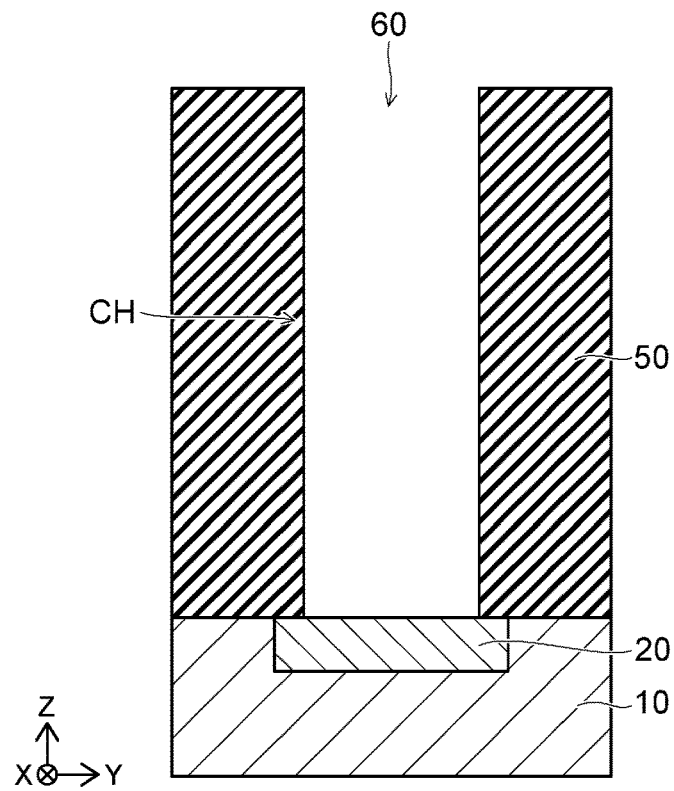
FIGS. 12A and 12B are sectional views illustrating a method of manufacturing the semiconductor memory device according to the third exemplary embodiment.

First, as illustrated in FIG. 12A, the insulating layer 50 is formed on the substrate 10, and then, the hole 60 is formed in the insulating layer 50. The hole 60 has the contact hole CH. Subsequently, a stacked layer of titanium and titanium nitride is formed in the contact hole CH, and then, an annealing process is performed on the stacked layer. By the annealing process, titanium and silicon react with each other so that the first conductive layer 20 which is a titanium silicide layer is formed on the upper end of the substrate 10.

Subsequently, a part (titanium and titanium nitride) of the stacked layer that has not reacted by the annealing process is removed. The first conductive layer 20 may be formed by forming another metal silicide layer in a recess portion formed on the substrate 10.

Figure 12B:
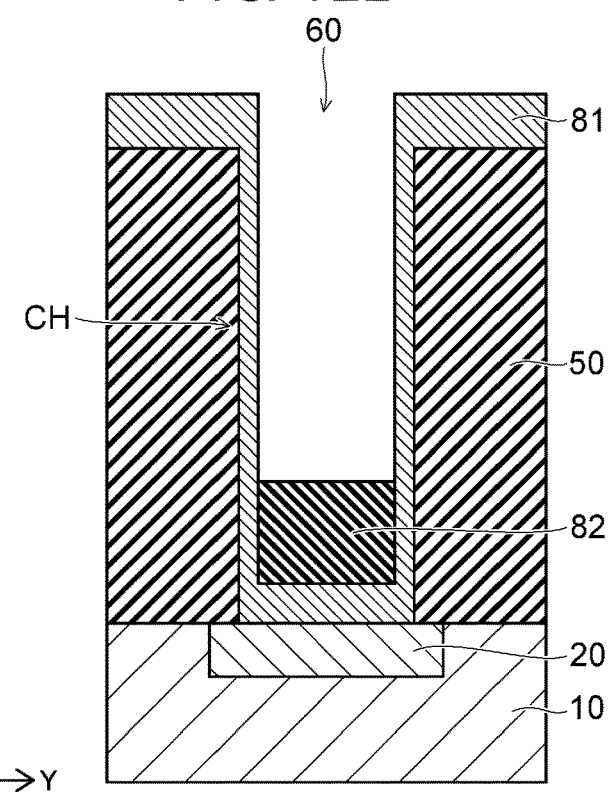

Next, as illustrated in FIG. 12B, a layer 81 is formed on the inner surface of the contact hole CH by, for example, a PVD method. In the layer 81, for example, tungsten is formed. The layer 81 is formed on the first conductive layer 20. Further, the layer 81 is formed on the insulating layer 50.

Subsequently, a resist 82 is formed on the layer 81, and then, etched back by, for example, a RIE method. As a result, the resist 82 remains on a part of the layer 81 in the contact hole CH.

Figure 13A:
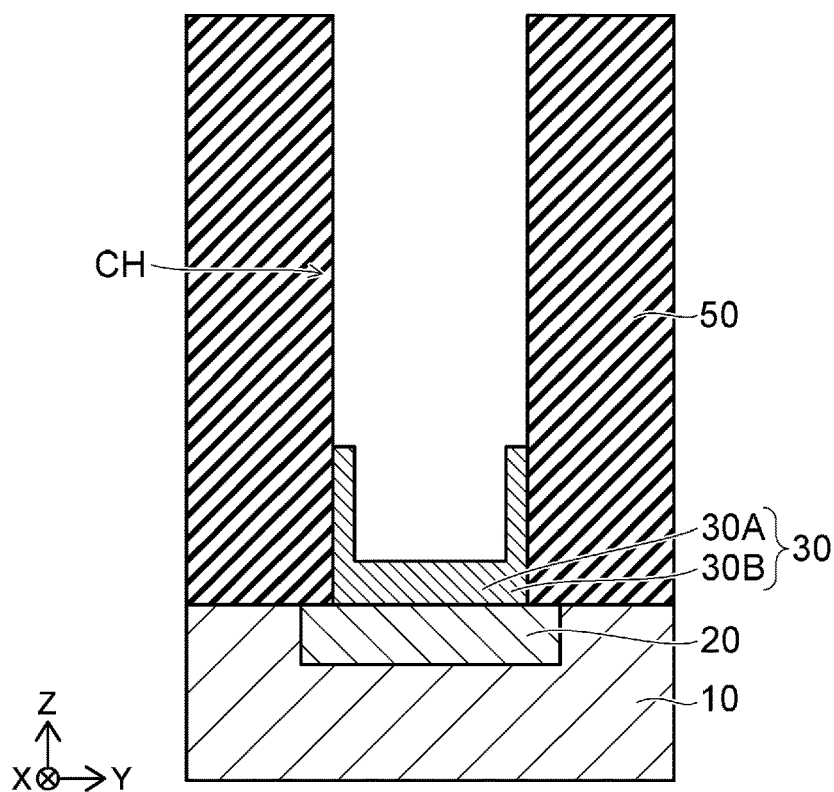
FIGS. 13A and 13B are sectional views illustrating the method of manufacturing the semiconductor memory device according to the third exemplary embodiment.

Next, as illustrated in FIG. 13A, a part of the layer 81 is removed by using a cleaning liquid through the contact hole CH. For example, the cleaning liquid is a mixed aqueous solution of sulfuric acid and hydrogen peroxide water. A part of the layer 81 may be removed by a CDE method, instead of using the cleaning liquid. Accordingly, the second conductive layer 30 having the central portion 30A and the peripheral portion 30B is formed. Subsequently, the resist 82 is removed.

Figure 13B:
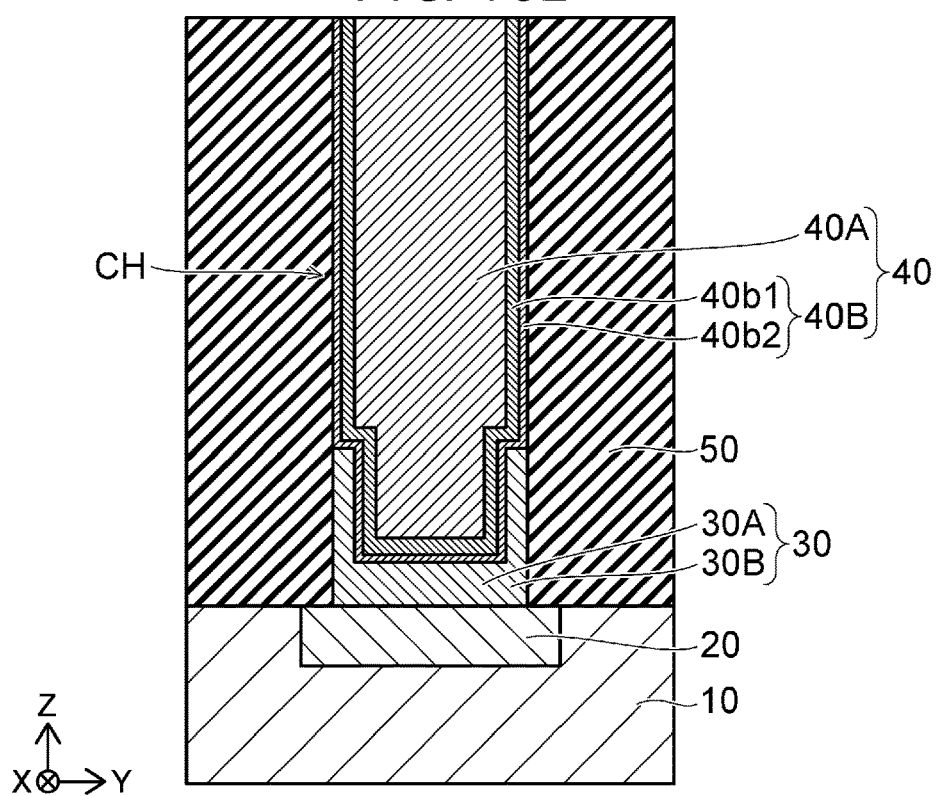

Next, as illustrated in FIG. 13B, the layer 40b2 containing titanium is formed on the inner wall surface of the contact hole CH and the conductive layer 30, and then, the layer 40b1 containing titanium nitride is formed on the layer 40b2 in the contact hole CH. Accordingly, the peripheral portion 40B having the layers 40b1 and 40b2 is formed.

Subsequently, the main body portion 40A containing a metal such as tungsten is formed on the peripheral portion 40B (the layer 40b1) in the contact hole CH. Accordingly, the contact plug 40 having the main body portion 40A and the peripheral portion 40B is formed. The subsequent processes are the same as those in the first exemplary embodiment.

In this way, the semiconductor memory device 3 according to the present exemplary embodiment is manufactured.

According to the semiconductor memory device 3 of the present exemplary embodiment, the deterioration of the electric characteristic due to the increase of the resistance of the contact plug can be prevented, as in the first exemplary embodiment.

Fourth Exemplary Embodiment

Figure 14:
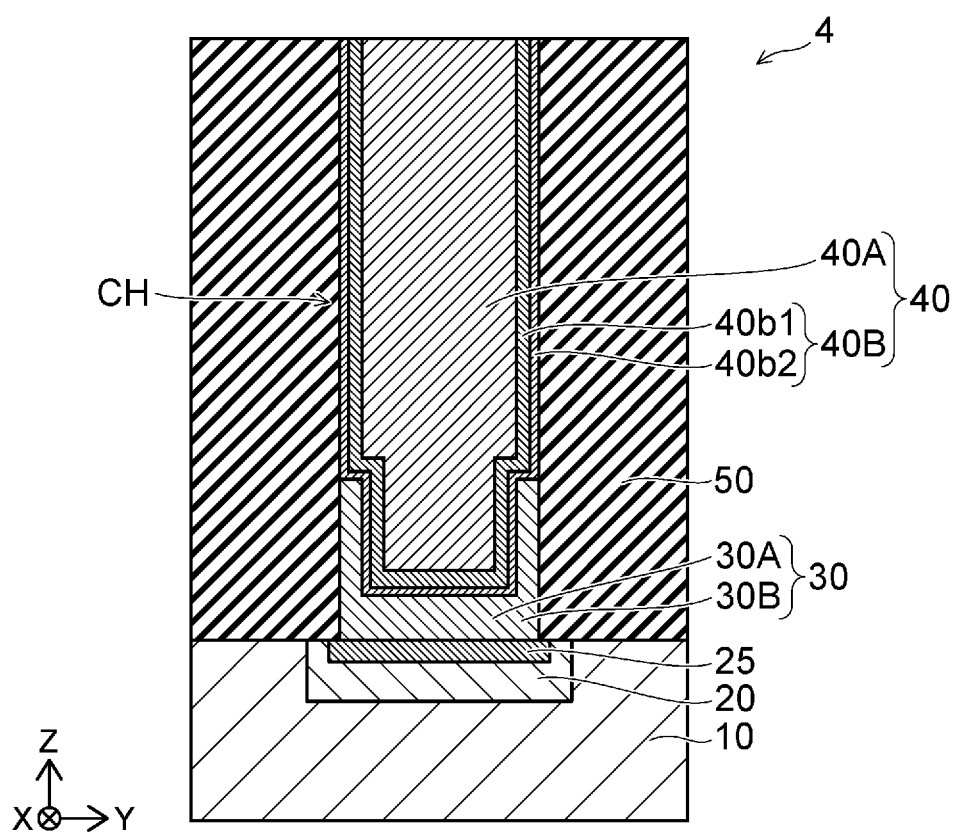
FIG. 14 is a sectional view illustrating a semiconductor memory device according to a fourth exemplary embodiment.

FIG. 14 is a sectional view of a semiconductor memory device 4.

The regions represented in FIG. 14 correspond to the regions represented in FIG. 1.

The semiconductor memory device 4 according to the present exemplary embodiment is different from the semiconductor memory device 2 according to the second exemplary embodiment in the shape of the second conductive layer 30. Since the configurations of the fourth exemplary embodiment other than the shape of the second conductive layer 30 are identical to those in the second exemplary embodiment, detailed descriptions thereof will be omitted.

As illustrated in FIG. 14, the semiconductor memory device 4 is provided with the substrate 10, the first conductive layer 20, the third conductive layer 25, the second conductive layer 30, the contact plug 40, and the insulating layer 50.

The second conductive layer 30 is formed on the third conductive layer 25. The second conductive layer 30 has the central portion 30A and the peripheral portion 30B. The peripheral portion 30B surrounds the periphery of the central portion 30A. The central portion 30A and the peripheral portion 30B are formed to be integrated with each other so that the second conductive layer 30 has the shape of, for example, the character C in the Y-Z plane.

The contact plug 40 is provided on the second conductive layer 30.

Next, a method of manufacturing the semiconductor memory device according to the present exemplary embodiment will be described.

Figure 15A:
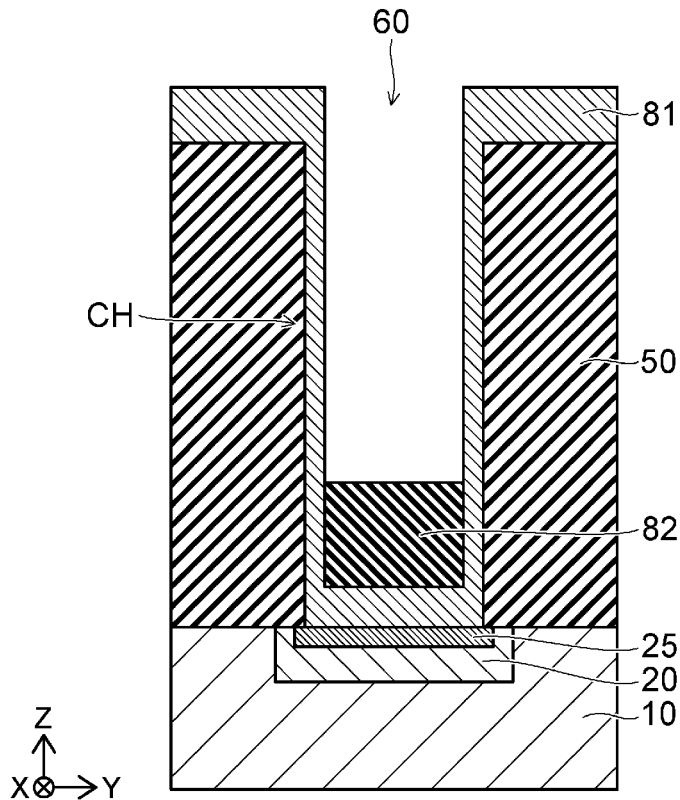
FIGS. 15A and 15B are sectional views illustrating a method of manufacturing the semiconductor memory device according to the fourth exemplary embodiment.
Figure 15B:
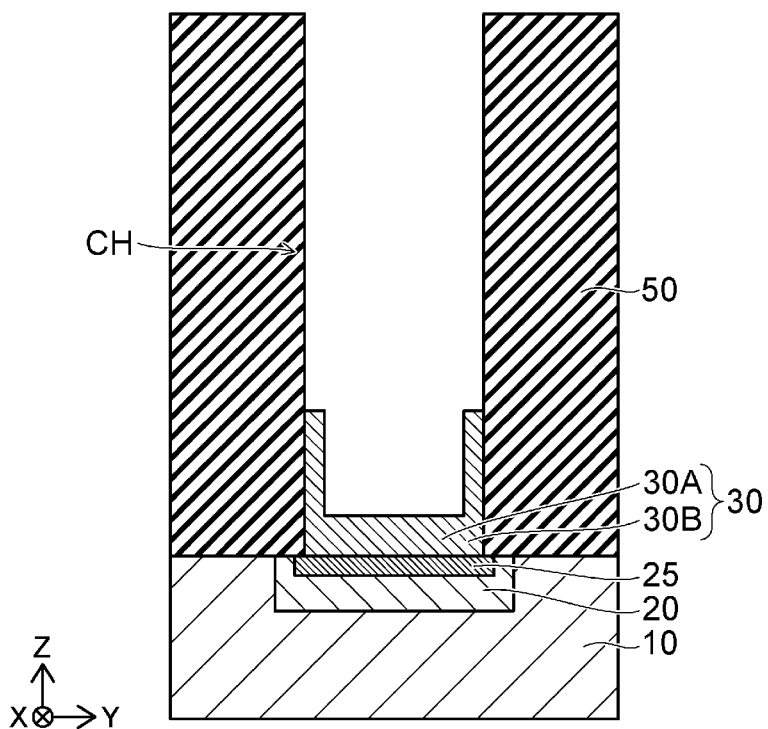
Figure 16:
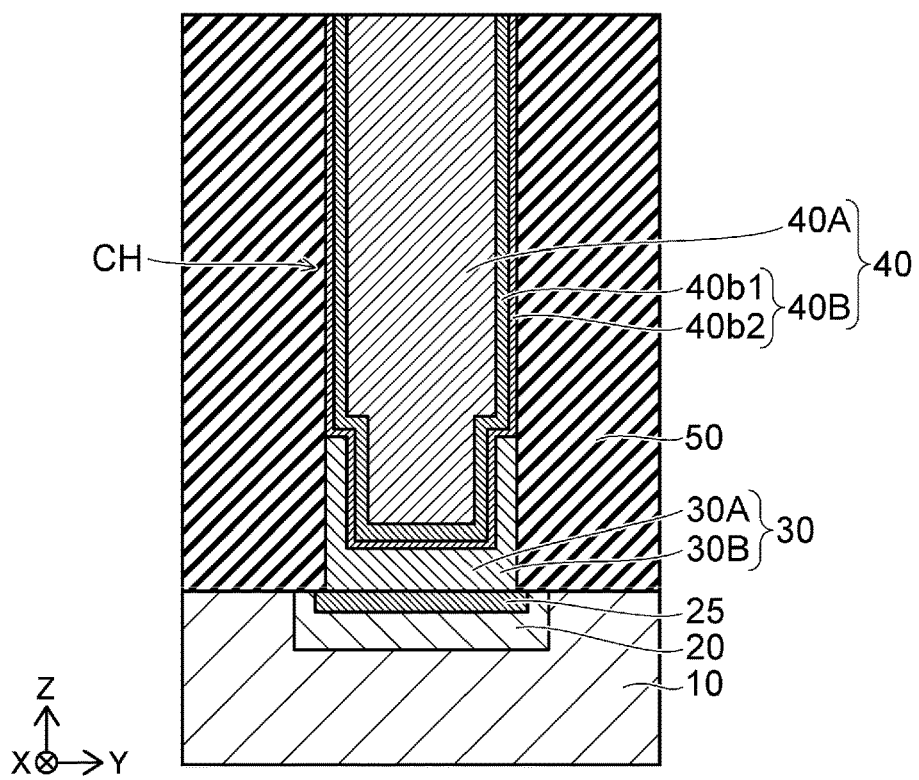
FIG. 16 is a sectional view illustrating the method of manufacturing the semiconductor memory device according to the fourth exemplary embodiment.

FIGS. 15A, 15B, and 16 are sectional views illustrating a method of manufacturing the semiconductor memory device 4. The regions represented in FIGS. 15A, 15B, and 16 correspond to the regions represented in FIG. 14. Since the processes prior to the formation of the second conductive layer 30 in the present exemplary embodiment are the same as those in the second exemplary embodiment, detailed descriptions and drawings thereof will be omitted.

The third conductive layer 25 is formed in the first conductive layer 20, and then, as illustrated in FIG. 15A, the layer 81 containing tungsten or the like is formed on the inner surface of the contact hole CH. The layer 81 is formed on the third conductive layer 25. Further, the layer 81 is formed on the insulating layer 50.

Subsequently, the resist 82 is formed on the layer 81, and then, etched back. As a result, the resist 82 remains on a part of the layer 81.

Next, as illustrated in FIG. 15B, a part of the layer 81 is removed through the contact hole CH. Accordingly, the conductive layer 30 having the central portion 30A and the peripheral portion 30B is formed. Subsequently, the resist 82 is removed.

Next, as illustrated in FIG. 16, the layer 40b2 containing titanium is formed on the inner wall surface of the contact hole CH and the conductive layer 30, and then, the layer 40b1 containing titanium nitride is formed on the layer 40b2 in the contact hole CH. Accordingly, the peripheral portion 40B having the layers 40b1 and 40b2 is formed.

Subsequently, the main body portion 40A containing a metal such as tungsten is formed on the peripheral portion 40B (the layer 40b1) in the contact hole CH. Accordingly, the contact plug 40 having the main body portion 40A and the peripheral portion 40B is formed. The subsequent processes are the same as those in the first exemplary embodiment.

In this way, the semiconductor memory device 4 according to the present exemplary embodiment is manufactured.

According to the semiconductor memory device 4 of the present exemplary embodiment, the deterioration of the electric characteristic due to the increase of the resistance of the contact plug can be prevented, as in the first exemplary embodiment.

Fifth Exemplary Embodiment

Figure 17:
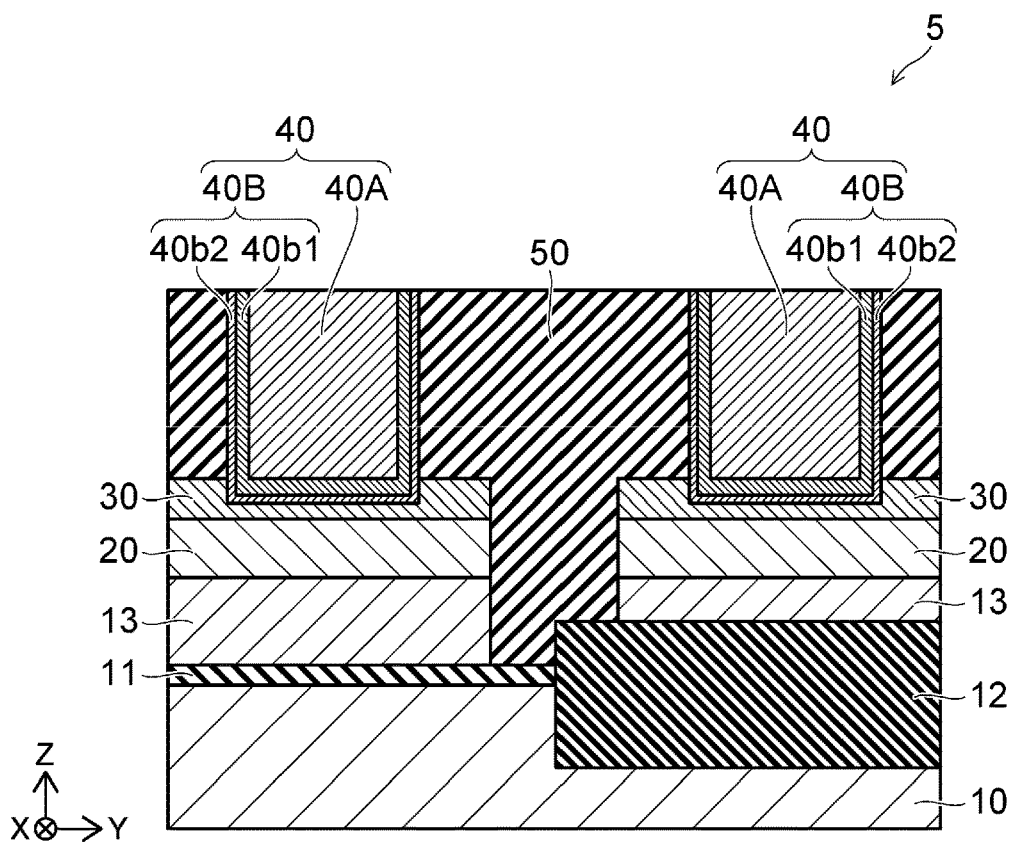
FIG. 17 is a sectional view illustrating a semiconductor memory device according to a fifth exemplary embodiment.

FIG. 17 is a sectional view illustrating a semiconductor memory device 5.

FIG. 17 represents the Y-Z cross section of the connection portion between the substrate 10 and the contact plug 40 in the semiconductor memory device 5.

As illustrated in FIG. 17, the semiconductor memory device 5 is provided with the substrate 10, an insulating layer 11, an insulating layer 12, a fourth conductive layer 13, the first conductive layer 20, the second conductive layer 30, the contact plug 40, and the insulating layer 50.

The insulating layers 11 and 12 are provided on the substrate 10. The insulating layers 11 and 12 contain, for example, silicon oxide. For example, the insulating layer 11 is a gate oxide layer, and the insulating layer 12 is an element isolation layer. The insulating layer 12 is, for example, shallow trench isolation (STI).

The fourth conductive layer 13 is provided on each of the insulating layers 11 and 12. The fourth conductive layer 13 contains, for example, polysilicon. In the Y direction, the insulating layer 50 is located between the fourth conductive layers 13.

The first conductive layer 20 is provided on the fourth conductive layer 13, and the second conductive layer 30 is provided on the first conductive layer 20. The contact plug 40 is provided on the second conductive layer 30. That is, the structure having the fourth conductive layer 13, the first conductive layer 20, the second conductive layer 30, and the contact plug 40 is provided on each of the insulating layers 11 and 12 via the insulating layer 50 in the Y direction.

Next, a method of manufacturing the semiconductor memory device according to the present exemplary embodiment will be described.

FIGS. 18A, 18B, 19A, and 19B are sectional views illustrating a method of manufacturing the semiconductor memory device 5. The regions represented in FIGS. 18A, 18B, 19A, and 19B correspond to the regions represented in FIG. 17. Hereinafter, descriptions will be made on forming the connection portion between the substrate 10 and the contact plug 40 in the method of manufacturing the semiconductor memory device 5.

Figure 18A:
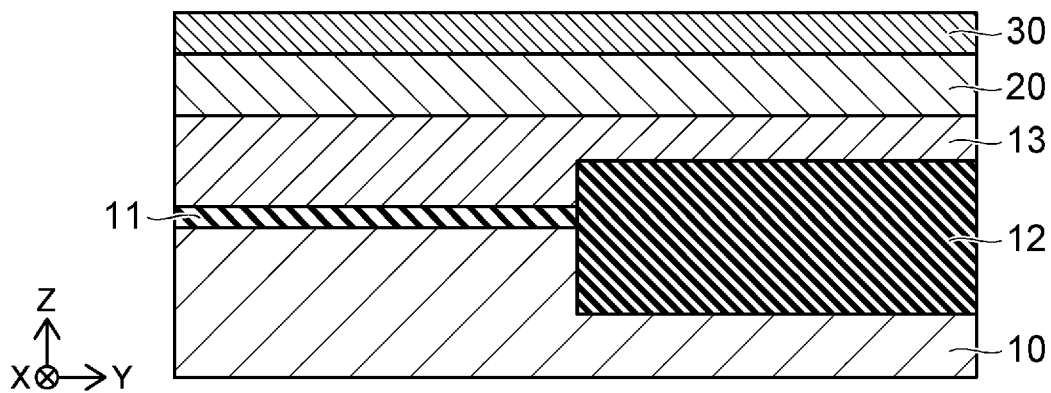
FIGS. 18A and 18B are sectional views illustrating a method of manufacturing the semiconductor memory device according to the fifth exemplary embodiment.

First, as illustrated in FIG. 18A, the insulating layers 11 and 12 are formed on the substrate 10. Subsequently, the fourth conductive layer 13, the first conductive layer 20, and the second conductive layer 30 are formed in order on the insulating layers 11 and 12 by, for example, a CVD method or a PVD method. The fourth conductive layer 13 is formed of, for example, polysilicon. The first conductive layer 20 is formed of, for example, tungsten silicide. The second conductive layer 30 is formed of, for example, tungsten.

Figure 18B:
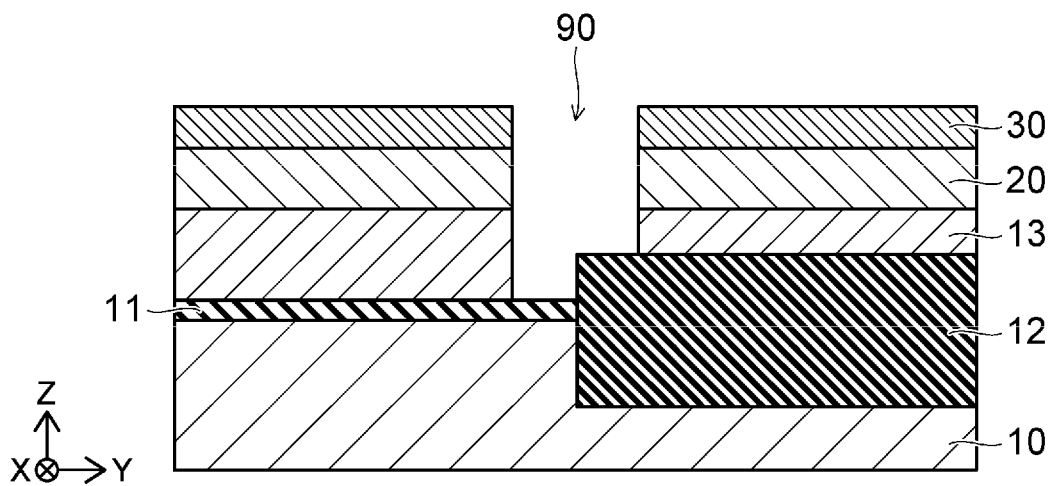

Next, as illustrated in FIG. 18B, a trench 90 is formed in the fourth conductive layer 13, the first conductive layer 20, and the second conductive layer 30 by, for example, a photolithography method and a RIE method. The trench 90 extends in the Z direction, and penetrates the fourth conductive layer 13, the first conductive layer 20, and the second conductive layer 30 to reach the insulating layers 11 and 12.

Figure 19A:
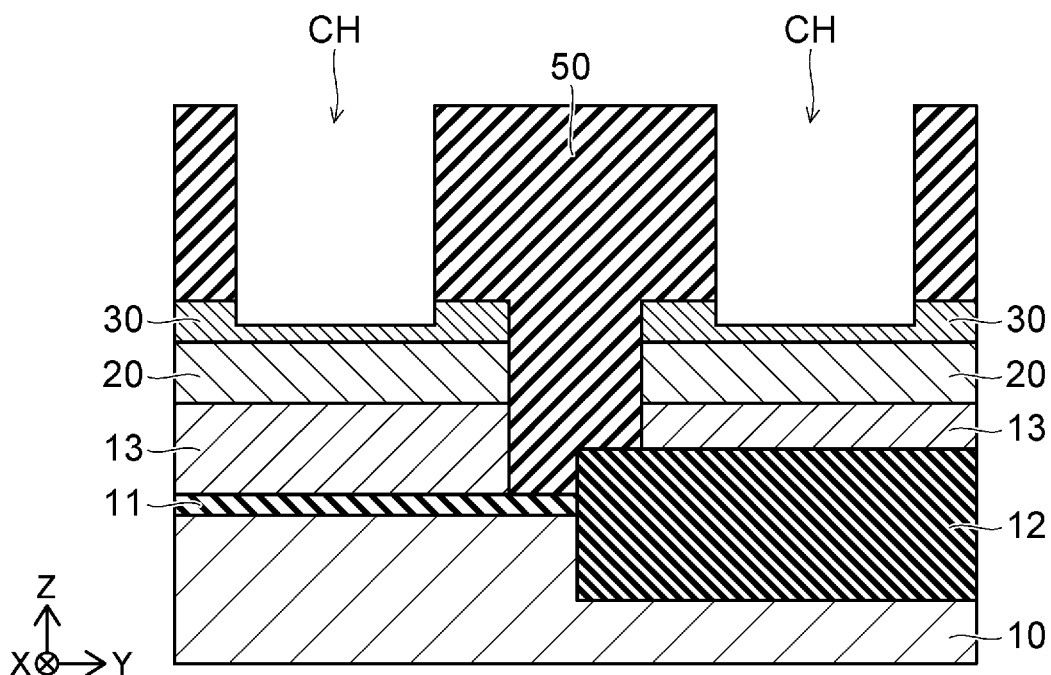
FIGS. 19A and 19B are sectional views illustrating the method of manufacturing the semiconductor memory device according to the fifth exemplary embodiment.

Next, as illustrated in FIG. 19A, the insulating layer 50 is formed in the trench 90 by, for example, a CVD method. The insulating layer 50 is also formed on the second conductive layer 30. Subsequently, the contact hole CH is formed in the insulating layer 50 by, for example, a photolithography method and a RIE method. The contact hole CH extends in the Z direction, and penetrates the insulating layer 50 to reach the second conductive layer 30.

Figure 19B:
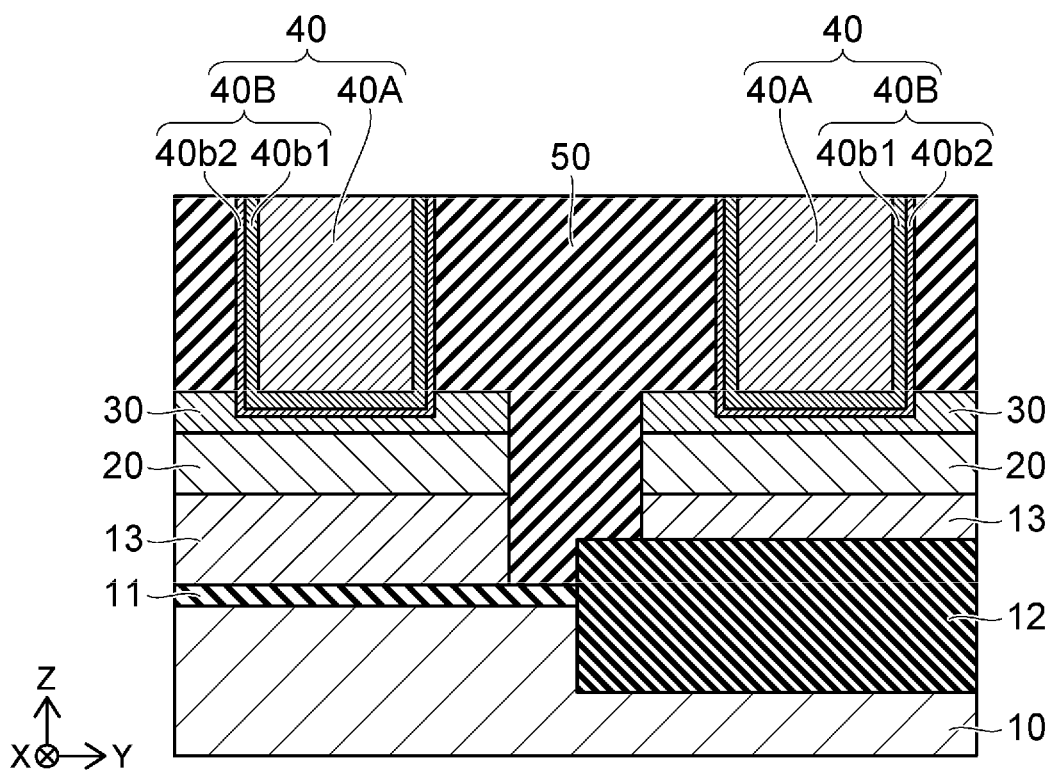

Next, as illustrated in FIG. 19B, the layer 40b2 containing titanium may be formed on the inner wall surface of the contact hole CH and the conductive layer 30 by, for example, a CVD method. Then, the layer 40b1 containing titanium nitride is formed on the layer 40b2 in the contact hole CH. Accordingly, the peripheral portion 40B having the layers 40b1 and 40b2 is formed.

Subsequently, the main body portion 40A containing a metal such as tungsten is formed on the peripheral portion 40B (the layer 40b1) in the contact hole CH by, for example, a CVD method. Accordingly, the contact plug 40 having the main body portion 40A and the peripheral portion 40B is formed.

Subsequently, a titanium layer, a titanium nitride layer, and a metal layer formed on, for example, the upper surface of the insulating layer 50 outside the contact hole CH are removed by, for example, a CMP method. Then, an upper layer wiring (not illustrated) is formed on, for example, the upper end of the contact plug 40.

In this way, the semiconductor memory device 5 according to the present exemplary embodiment is manufactured. In the processes represented in FIGS. 18A, 18B, 19A, and 19B, after the first conductive layer 20, the trench 90, the insulating layer 50, and the contact hole CH are formed in order, the second conductive layer 30 may be selectively formed on the first conductive layer 20 via the contact hole CH by, for example, a selective CVD method. In this case, after the formation of the second conductive layer 30, the peripheral portion 40B having the layers 40b1 and 40b2 is formed on the inner wall surface of the contact hole CH and the second conductive layer 30.

Next, a modification of the present exemplary embodiment will be described.

Figure 20:
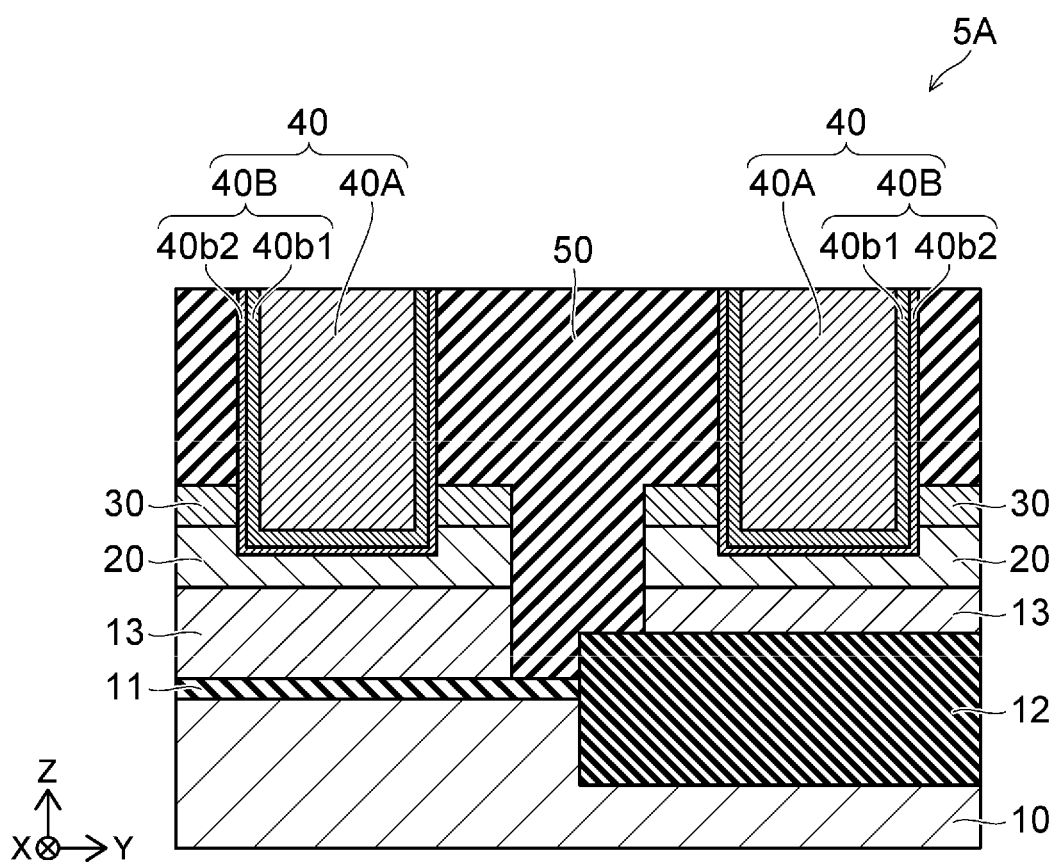
FIG. 20 is a sectional view illustrating a semiconductor memory device according to a modification of the fifth exemplary embodiment.

FIG. 20 is a sectional view illustrating a semiconductor memory device 5A. The regions represented in FIG. 20 correspond to the regions represented in FIG. 17. In this modification, the contact plug 40 is formed in a different position from that in the fifth exemplary embodiment.

As illustrated in FIG. 20, the semiconductor memory device 5A is provided with the substrate 10, the insulating layer 11, the insulating layer 12, the fourth conductive layer 13, the first conductive layer 20, the second conductive layer 30, the contact plug 40, and the insulating layer 50.

The contact plug 40 is provided on the first conductive layer 20. That is, the contact plug 40 penetrates the second conductive layer 30 such that the bottom surface of the contact plug 40 reaches the first conductive layer 20. For example, in the processes of FIGS. 19A and 19B, the contact hole CH is formed to penetrate the insulating layer 50 and the second conductive layer 30, and then, the contact plug 40 is formed in the contact hole CH.

According to the semiconductor memory device 5 (5A) of the present exemplary embodiment, the deterioration of the electric characteristic due to the increase of the resistance of the contact plug can be prevented, as in the first exemplary embodiment.

In addition, in a case where the contact plug 40 is provided to penetrate the second conductive layer 30 and reach the first conductive layer 20 as in the semiconductor memory device 5A of the present modification, when the oxide layer 70B is formed, the oxide layer 70B is formed in the portion where the first conductive layer 20 and the peripheral portion 40B (the layer 40b2) are in contact with each other, whereas the oxide layer 70B is barely formed in the portion of the side wall of the contact plug 40 where the second conductive layer 30 and the peripheral portion 40B (the layer 40b2) are in contact with each other. Accordingly, the contact resistance may be reduced.

While a case where each of the exemplary embodiments is a semiconductor memory device has been described, the connection portion between the substrate and the contact plug and the method of forming the connection portion in the exemplary embodiments may be applied to, a semiconductor memory device having a three-dimensional structure and a manufacturing method thereof. For example, in a semiconductor memory device having a three-dimensional structure, when the substrate and the upper layer wiring are connected to each other via the contact plug, the first conductive layer 20, the second conductive layer 30, and the contact plug 40 are formed on the substrate 10 so that the upper layer wiring may be electrically connected to the substrate 10 via the contact plug 40. In addition, as described above, an insulating layer (e.g., the insulating layer 50) or a stacked body (e.g., the stacked body 15) may be provided around the second conductive layer 30 and the contact plug 40. In the stacked body, insulating layers may be alternately stacked, and an insulating layer and a conductive layer may be alternately stacked.

In addition, in these exemplary embodiments, the connection portion between the substrate and the contact plug and the method of forming the connection portion may be applied to a semiconductor memory device having a two-dimensional structure and a manufacturing method thereof. In addition, the present disclosure is not limited to a semiconductor memory device and may be applied to various semiconductor devices.

By using the connection portion between the substrate and the contact plug and the method of forming the connection portion in these exemplary embodiments, the increase of the resistance between the conductive layer 20 and the contact plug 40 is prevented. As a result, the electric characteristic of the semiconductor memory device is improved.

The contact plug in each of the first to fourth exemplary embodiments described above is applied to general contact plugs on a semiconductor substrate. For example, the contact plug includes a contact on a transistor diffusion layer, a Well contact, a diffusion layer resistance contact, a PN diode contact and other implementations.

In addition, the contact plug described in the fifth exemplary embodiment includes a contact plug on a gate electrode of a MOS transistor, a contact plug on a poly resistance using poly-Si of a gate electrode as a resistor, and other implementations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a first conductive layer disposed on the substrate and comprising metal silicide;
   a second conductive layer disposed directly on the first conductive layer and including a metal having bond dissociation energy larger than a bond dissociation energy of the metal silicide; and
   a contact plug, disposed on the second conductive layer, that includes: (a) a main body portion that includes a metal, and (b) a peripheral portion disposed on a bottom surface and a side surface of the main body portion, the peripheral portion including titanium.

2. The semiconductor device according to claim 1, wherein the peripheral portion is disposed on a side surface and a bottom surface of the main body portion.

3. The semiconductor device according to claim 1, wherein the substrate includes a recess and the first conductive layer is disposed in the recess of the substrate.

4. The semiconductor device according to claim 1, further comprising an insulating layer having a contact hole, wherein the contact plug is disposed in the contact hole of the insulating layer.

5. The semiconductor device according to claim 4, wherein the insulating layer comprises a stacked body having a plurality of insulating layers.

6. The semiconductor device according to claim 1, further comprising an insulating layer having a contact hole, wherein the second conductive layer and the contact plug are disposed entirely within the contact hole of the insulating layer.

7. The semiconductor device according to claim 1, wherein the first conductive layer comprises any one of titanium silicide, tungsten silicide, cobalt silicide, or nickel silicide, and
   the second conductive layer comprises any one of tungsten, niobium, rhenium, or titanium.

8. The semiconductor device according to claim 1,
   wherein the peripheral portion has (a) a first layer disposed on the bottom surface and the side surface of the main body portion and includes titanium nitride and (b) a second layer disposed on a surface of the first layer and includes titanium.

9. The semiconductor device according to claim 1, further comprising:

a third conductive layer, disposed between the first and second conductive layers, and including titanium nitride.

10. The semiconductor device according to claim 9, wherein a side surface and a bottom surface of the third conductive layer is surrounded by the first conductive layer.

\* \* \* \* \*